United States Patent
Nguyen Hoang et al.

(10) Patent No.: US 7,709,387 B2
(45) Date of Patent: May 4, 2010

(54) POLISHING APPARATUS AND TWO-STEP METHOD OF POLISHING A METAL LAYER OF AN INTEGRATED CIRCUIT

(75) Inventors: Viet Nguyen Hoang, Delft (NL); Roel Daamen, Posterholt (NL)

(73) Assignee: NXP B.V., Eindhoven (NL)

( * ) Notice: Subject to any disclaimer, the term of this patent is extended or adjusted under 35 U.S.C. 154(b) by 788 days.

(21) Appl. No.: 10/544,411

(22) PCT Filed: Jan. 23, 2004

(86) PCT No.: PCT/IB2004/050047

§ 371 (c)(1),
(2), (4) Date: Aug. 3, 2005

(87) PCT Pub. No.: WO0004/073060

PCT Pub. Date: Aug. 26, 2004

(65) Prior Publication Data

US 2006/0134915 A1  Jun. 22, 2006

(30) Foreign Application Priority Data

Feb. 11, 2003  (EP)  ................... 03100284

(51) Int. Cl.
*H01L 21/302*  (2006.01)
(52) U.S. Cl. .................... 438/689; 257/21.641
(58) Field of Classification Search .......... 438/692, 438/618, 689
See application file for complete search history.

(56) References Cited

U.S. PATENT DOCUMENTS

| 6,326,299 | B1 * | 12/2001 | Homma et al. | 438/633 |
| 6,436,829 | B1 * | 8/2002 | Layadi et al. | 438/691 |
| 6,465,354 | B1 * | 10/2002 | Sugai et al. | 438/692 |
| 6,482,743 | B1 | 11/2002 | Sato | |
| 2001/0055941 | A1 * | 12/2001 | Koos et al. | 451/57 |
| 2002/0098673 | A1 * | 7/2002 | Yeh et al. | 438/618 |
| 2003/0181050 | A1 * | 9/2003 | Hu et al. | 438/694 |

FOREIGN PATENT DOCUMENTS

EP  1 085 067  3/2001

OTHER PUBLICATIONS

Kondo et al: "Abrasive-Free Polishing for Copper Damascene Interconnection" Journal of the Electrochemical Society, Mar. 27, 2000.

* cited by examiner

*Primary Examiner*—Thao X Le
*Assistant Examiner*—Elias Ullah

(57) ABSTRACT

The method of manufacturing an integrated circuit (IC) according to the invention starts with providing a pre-fabricated integrated circuit (10) comprising an electrical device (2) and having a surface (11) coated with a dielectric material (12) and a metal (15). The dielectric material (12), which may be separated from the metal (15) by the barrier layer (14), has an opening (13), which is filled with the metal (15). Portions of the metal (15) outside the opening (13) are removed by polishing for a first period of time, after which an etching agent (25) is added to the polishing liquid (24) and polishing is continued for a second period of time for removing portions of the metal (15) remaining outside the opening (13). The polishing apparatus (40) is able to perform the method.

20 Claims, 2 Drawing Sheets

Figure 1A:
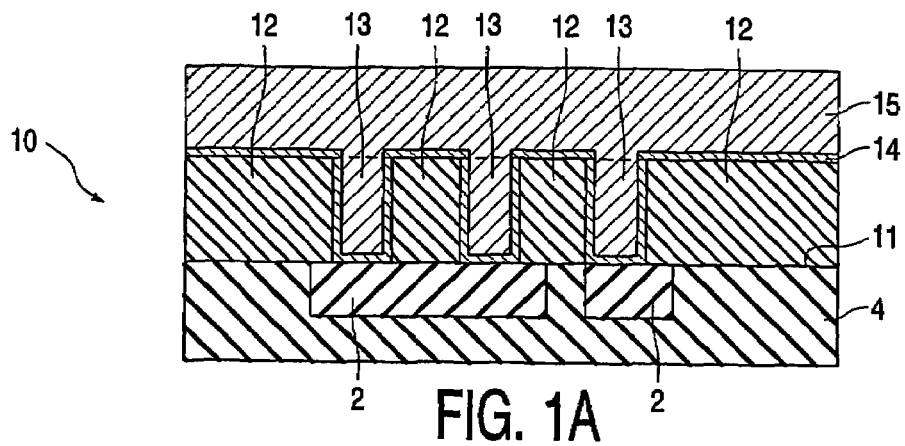

POLISHING APPARATUS AND TWO-STEP METHOD OF POLISHING A METAL LAYER OF AN INTEGRATED CIRCUIT

The invention relates to a method of manufacturing an integrated circuit (IC), the method comprising the steps of providing a pre-fabricated IC comprising an electrical device and having a surface coated with in this order, a dielectric material and a metal, the dielectric material having an opening, and the metal extending into the opening thereby electrically contacting the electrical device, and removing portions of the metal outside the opening by polishing using a polishing liquid.

The invention further relates to a polishing apparatus for carrying out this method.

The article "Abrasive-free polishing for copper damascene interconnection" by S. Kondo et al., published in the Journal of the Electrochemical Society, volume 147, page 3907-3913 in 2000 discloses an embodiment of a method described in the opening paragraph.

Usually, ICs are equipped with at least one electrical device and with an in-laid metal structure which connects the electrical device with terminals at the outer surface of the IC and with other electrical devices, if present. The terminals can be used to provide the electrical input signals and output signals to the IC. When more than one electrical device is present, the shape of the in-laid metal structure determines which functions can be performed by the IC.

The in-laid metal structure may comprise several levels of metal lines and vias which connect metal lines of, e.g., adjacent levels. The metal lines are mutually electrically insulated by a dielectric material.

When manufacturing the in-laid metal structure of an IC, first a layer of the dielectric material is deposited and one or more openings are made in the dielectric material. The openings may be made at the positions of the in-laid metal structure or of the electrical device by means of, e.g., lithography and etching. Subsequently, the metal is deposited into the openings thereby electrically contacting the at least one electrical device. The electrical device may be contacted directly or, alternatively, it may be contacted by contacting an interconnect structure which is contacted to the electrical device. After the deposition, the metal is present also outside the openings. The IC obtained by these steps is referred to as a pre-fabricated IC.

Because the metal outside the openings may cause short-circuits between metal lines, it needs to be removed before new parts of the in-laid metal structure can be manufactured. To this end the pre-fabricated IC provided with the metal is polished after depositing the metal. For further processing it is normally also required that, after polishing, the dielectric material and the metal inside the openings form a relatively smooth surface on which the next level of the in-laid metal structure can be deposited.

During polishing, in particular the following two effects have to be avoided: removing parts of the dielectric material around the patterned metal, often referred to as erosion, and/or removing parts of the metal inside the openings, often referred to as dishing. In the known method these two unwanted effects are minimized by optimizing polishing parameters such as the chemical composition of the polishing liquid, the mechanical structure of the polishing surface, the rotational speed of the polishing surface and the pressure with which the pre-fabricated IC is pressed against the polishing surface.

The point in time when the metal outside the openings is removed to such an extent that the underlying layer of material is exposed, is typically referred to as the end point of the polishing process. In the known method the metal residues which are present outside the openings when the end point is reached, are removed by a process called overpolishing, i.e. polishing continues after reaching the end point for a so-called overpolish time in order to remove the metal residues.

It is a disadvantage of the known method of manufacturing an IC that the yield is relatively low because either the overpolish time is too short and metal residues remain on the surface, or the overpolish time is long enough to remove the metal residues but too long to avoid erosion and/or dishing. Due to these two effects the resulting in-laid metal structure may have an electrical resistance which does not comply with the predetermined specifications, and the IC has to be rejected, resulting in a lower yield.

It is an object of the invention to provide a method of the kind described in the opening paragraph which allows for manufacturing ICs with a relatively high yield.

The object according to the invention is realized in that, after polishing the pre-fabricated IC for a first period of time, an etching agent is added to the polishing liquid while continuing polishing for a second period of time for removing portions of the metal remaining outside the opening.

The pre-fabricated IC is first polished for the first period of time to remove portions of the metal outside the opening, analogous to the known method. Subsequently, the etching agent is added to the polishing liquid and polishing is continued for a second period of time.

The polishing liquid used in the known method also comprises an etching agent. The known polishing liquid further comprises an oxidizer to oxidize the metal and a corrosion inhibitor for controlling the removal rate of the metal. In the polishing liquid of the known method the respective concentrations of the etching agent, the oxidizer and the corrosion inhibitor are chosen such that the metal is removed effectively while erosion and/or dishing are avoided. To obtain at least close-to-optimal results with respect to dishing and erosion, the respective concentrations of the etching agent, the oxidizer and the corrosion inhibitor have to be carefully adjusted. When using such a polishing liquid in a method according to the invention, the concentration of the etching agent is deliberately increased by adding the etching agent after the first period of time. According to the invention the etching agent comprised in the polishing liquid during the first period of time may be different from the etching agent added after the first period of time.

After adding the etching agent the polishing liquid is more corrosive and therefore, the metal is removed more effectively. If the polishing liquid comprises an oxidizer, adding the etching agent reduces the thickness of the oxidized metal, resulting in a higher metal removal rate. Therefore, the metal residuals are substantially reduced after a relatively short overpolish time. If the etching agent were added to the polishing liquid before starting the polishing operation, severe erosion and/or dishing would occur resulting in a lower yield. By adding the etching agent after the first period of time, erosion and/or dishing during the first period of time is not increased. However, some erosion and/or dishing may occur during the second period of time, i.e. after adding the etching agent. The invention is based on the observation that erosion and/or dishing during the second period of time is less severe than erosion and/or dishing due to the relatively long overpolish time in the known method.

It is a further advantage of the method according to the invention that the overpolish time is reduced, which results in a shorter total processing time and therefore, in a higher throughput and a corresponding reduction in costs.

It is yet another advantage of the method according to the invention that the electrical resistance of the in-laid metal structure obtained is relatively uniform, i.e. at different locations within the pre-fabricated IC the electrical resistance is substantially the same. When the pre-fabricated IC is part of a semiconductor wafer comprising several of these pre-fabricated ICs, the electrical resistance of the in-laid metal structures of these pre-fabricated ICs is relatively uniform as well.

Preferably, after the second period of time a further polishing liquid is added while continuing polishing for a third period of time for removing the etching agent from the pre-fabricated integrated circuit. In this way the etching agent is in contact with the surface of the pre-fabricated IC being polished only for a relatively short period of time which is determined mainly by the duration of the second period of time. Ideally, the etching agent is removed as fast as possible from this surface during the third period of time. The further polishing liquid may be substantially identical to the polishing liquid. Alternatively, it may be de-ionized water to which a corrosion inhibitor may be added.

It is advantageous if the third period of time is long enough to effectively remove the etching agent, but not too long in order to avoid dishing and/or erosion. It has been found experimentally that the duration of the third period of time is preferably between 15 and 120 seconds, and more preferably between 30 and 60 seconds.

It is advantageous if the second period of time is between 1 and 15 seconds. In the case of a longer second period of time erosion and/or dishing may deteriorate the yield. Ideally, the second period of time is as short as possible, yet still sufficient to effectively remove the metal residuals effectively. Preferably, the second period of time is shorter than 5 seconds, e.g. between 1 and 3 seconds.

In an embodiment the dielectric material and the metal of the pre-fabricated IC are separated by a barrier layer. In many cases the metal cannot be deposited directly onto the dielectric material because of the risk of diffusion of the metal into the dielectric material. Therefore, the barrier layer is often arranged between these two materials to counteract diffusion.

It is advantageous if a material comprising tantalum is used as the barrier layer. This material is very capable of preventing the diffusion of metal, in particular of copper, and it hardly diffuses itself into the dielectric material. Often it is supplied in a double layer of tantalum nitride and tantalum because the former material adheres well to the dielectric material, and metals, in particular copper, adhere well to the latter. Moreover, tantalum adheres well to tantalum nitride.

When the barrier layer is present, it is advantageous if during the first period of time the barrier layer is locally exposed. The inventors have gained the insight that in many cases the metal is removed at effectively a constant rate until the barrier layer is exposed. Once the barrier layer is exposed, the removal rate drops to close to zero and further removal of the metal residuals outside the openings is very slow. Adding the etching agent before the barrier layer is exposed therefore results in reduced erosion and/or dishing performance without reducing the metal residuals more effectively. Preferably, the first period of time ends once the barrier layer is exposed, and the etching agent is added directly after exposing the barrier layer.

It is advantageous if a substantially abrasive-free polishing liquid is used as the first polishing liquid. This type of polishing liquid, which contains no or only a small amount of abrasive particles, is very suited for the removal of relatively soft metals and results in a smooth polished surface. In particular, dishing is reduced.

The method according to the invention is particularly attractive if the dielectric material has a dielectric constant smaller than that of silicon dioxide. Such dielectric materials, which are attractive because the IC equipped with these materials has favorable high-frequency characteristics, are often mechanically relatively weak. Therefore, these materials are particularly sensitive to damage during overpolishing in the known method. The advantages of the method according to the invention are particularly evident for these materials.

In an embodiment the metal comprises copper. This metal is particularly attractive because the IC equipped with copper has favorable high-frequency characteristics. However, copper residuals are particularly difficult to remove by overpolishing according to the known method, whereas the method according to the invention is particularly effective in removing copper residuals.

It is advantageous if the pre-fabricated IC is polished using a polishing member having a polishing surface, the polishing surface being provided with the polishing liquid, the etching agent being added to the polishing liquid by providing the etching agent to the polishing surface. By adding the etching agent directly to the polishing surface it is possible to change the composition of the polishing liquid relatively fast. If the etching agent were added to the polishing liquid prior to dispensing the polishing liquid to the polishing surface, the buildup of a steady state after adding the etching agent would be relatively slow due to the final residence time of the polishing liquid on the polishing surface. The removal of the metal residuals is better and erosion and/or dishing are relatively small when the steady state is reached as quickly as possible. Ideally, adding the etching agent results in an etch shock.

The polishing apparatus according to the invention comprises an etching agent supply means for supplying an etching agent to the polishing surface and a system control means enabling the etching agent supply means to add the etching agent to the polishing liquid after having polished a pre-fabricated IC for a first period of time.

For a reliable execution of the method it is advantageous if the etching agent is added by etching agent supply means which is controlled by a system control means.

Preferably, the polishing apparatus further comprises an end point detector for detecting an end point and for providing an end point signal to the system control means, the system control means being arranged to enable the etching agent supply means to add the etching agent to the polishing liquid when being provided with the end point signal.

The best results were obtained when adding the etching agent at the moment when the layer directly below the metal is exposed. In the art of polishing, and in particular in the art of chemical mechanical polishing (CMP), end point detectors are well-known. The end point detector often is an optical system which measures the reflectivity of the surface of the pre-fabricated IC being polished. When a lower layer of material, e.g. the barrier layer if present, is exposed, the reflectivity of the surface changes and an end point signal is generated by the end point detector. This end point signal is provided to the system control means which, when provided with it, enables the etching agent supply means to add the etching agent to the polishing liquid. In this way it is assured that the etching agent is added at a point in time which results in particularly good results.

In an embodiment the polishing apparatus further comprises a workpiece holder for holding the pre-fabricated IC and for pressing it against the polishing surface, the polishing member being rotatable around an axis which is substantially perpendicular to the polishing surface, the polishing surface having an area which during polishing is contacted by the pre-fabricated IC, the etching agent supply means being arranged to supply the etching agent to at least part the area.

By using a rotatable polishing member and by supplying the etching agent to at least part the area which during polishing is contacted by the pre-fabricated IC, the point of time when the etching agent contacts the pre-fabricated IC is well-controlled. It is determined by the distance between the position where the etching agent is supplied to the polishing surface and the position of the pre-fabricated IC, and by the rotational speed of the polishing member.

Preferably, the workpiece holder is rotatable around a further axis which is substantially perpendicular to the polishing surface as well. By rotating the pre-fabricated IC, the etching agent is effectively distributed over the polishing surface which is contacted by the pre-fabricated IC, resulting in a spatially homogeneous action of the etching agent across the surface being polished.

In this embodiment of the polishing apparatus it is further advantageous if the area has an outer edge in a radial direction, the etching agent supply means being arranged to supply the etching agent close to the outer edge.

In general, the etching agent may be added to the polishing liquid anywhere on the polishing surface. Experimentally, it was observed that adding the etching agent close to the outer edge in the radial direction yielded the best results. This is attributed to the fact that in this case the etching agent was removed quickly by the rotation of the polishing member. The preferred position to supply the etching agent is as close as possible to the edge of the polishing surface, but still within the area which is contacted by the pre-fabricated IC during the polishing.

Figure 1B:
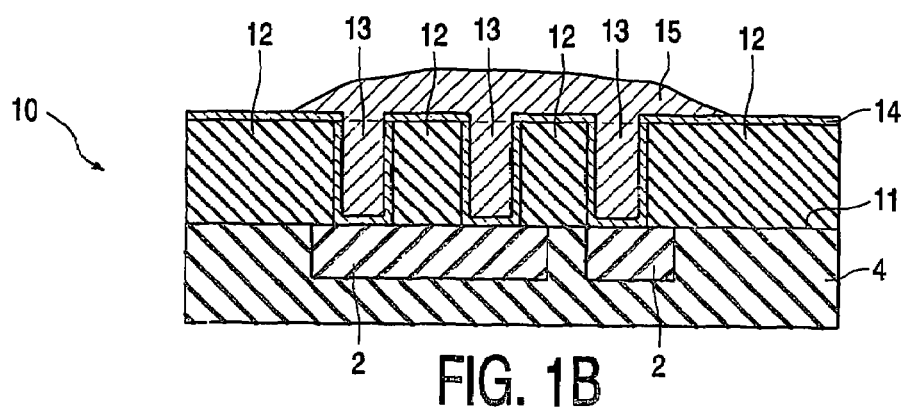
Figure 1C:
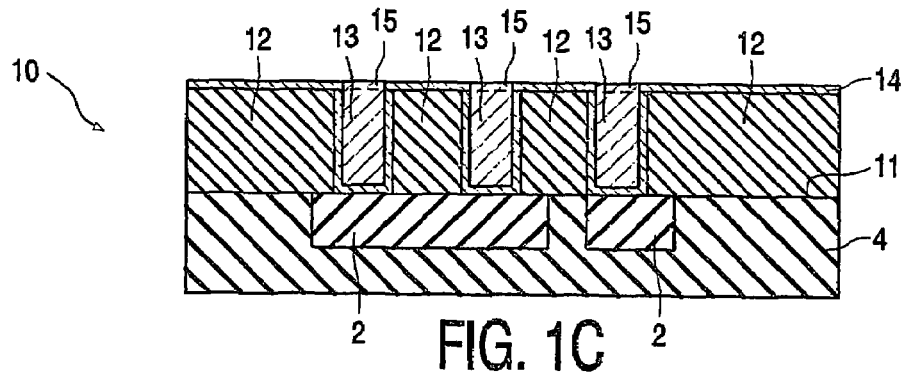
Figure 1D:
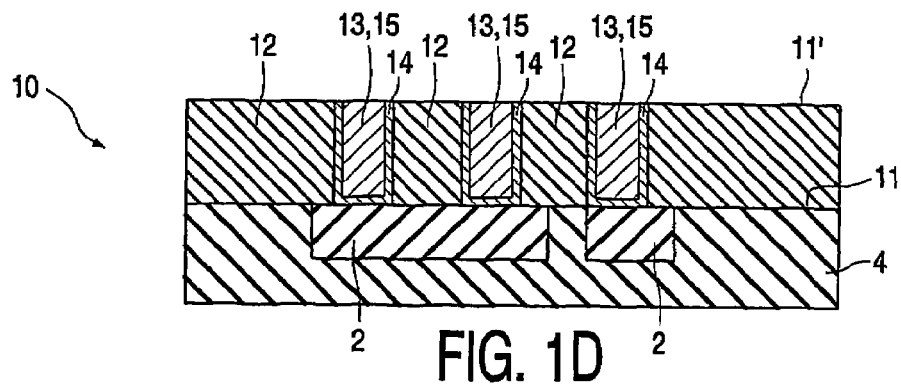
Figure 2:
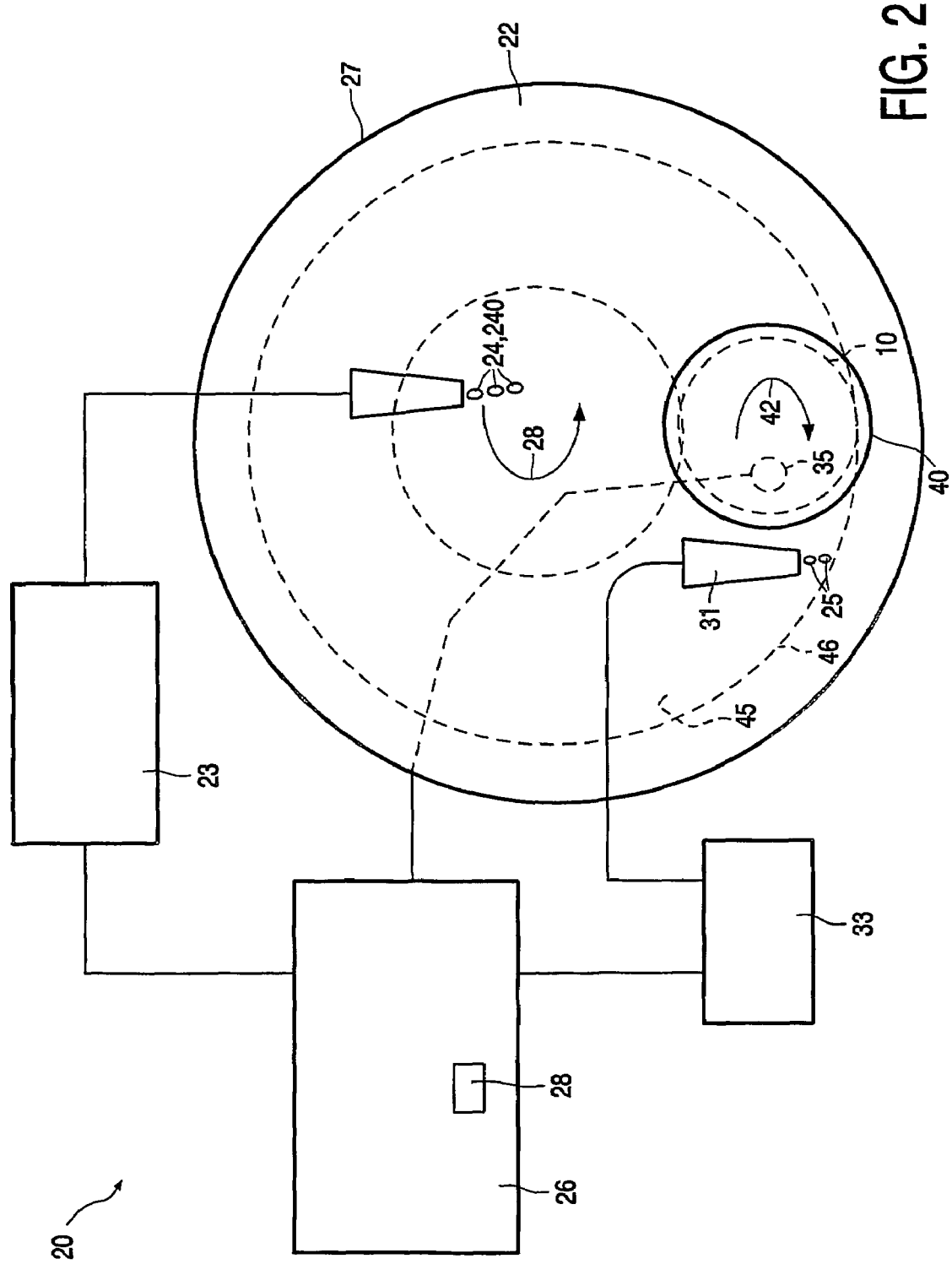

These and other aspects of the method of manufacturing an integrated circuit and of the polishing apparatus according to the invention will be further elucidated and described with reference to the drawings, in which:

FIGS. 1A-1D are cross-sections through the IC at various steps of the method, and FIG. 2 is a schematic drawing of the chemical mechanical polishing apparatus.

The Figures are not drawn to scale. In the Figures, like reference numerals generally refer to like parts.

The method for manufacturing an IC comprises the step of providing the pre-fabricated IC 10 shown in FIG. 1A. The pre-fabricated IC 10 comprises a substrate 4 with one or more electrical devices 2. The substrate 4 may be, e.g., a silicon, a silicon on insulator (SOI) or a silicon on anything (SOA) or a gallium arsenic wafer. The electrical device 2 may be, e.g., a transistor such as a metal oxide semiconductor field effect transistor (MOSFET), or any type of diode or any other electrical device, which can be integrated in an IC.

The pre-fabricated IC 10 has a surface 11 which is coated, in this order, with a dielectric material 12 and a metal 15. The dielectric material 12 has an opening 13 and the metal 15 extends into the opening 13 thereby electrically contacting the electrical devices 2. In the embodiment shown in FIGS. 1A-D the surface 11 is a surface of the substrate 4. In another embodiment, not shown, the surface coated with the dielectric material 12 and the metal 15 is a surface obtained after manufacturing part of the metal in-laid structure such as, e.g., the surface 11' shown in FIG. 1D.

The metal 15 may comprise, e.g., aluminum, tungsten or, preferably, copper. The dielectric material 12 may be silicon dioxide or, preferably, a dielectric material which has a dielectric constant smaller than silicon dioxide, often referred to as low-K material, such as, e.g., porous SiLK™. This material is described in Waeterloos, J. J. et al., "Integration feasibility of porous SiLK semiconductor dielectric", in Proceedings of the IEEE 2001 International Interconnect Technology Conference, Burlingame, Calif., USA, 4-6 Jun. 2001, p. 253-4. It is marketed by Dow Chemical from Midland, Mich., USA. Alternatively, a material as described in U.S. Pat. No. B1-6,352,945 and/or U.S. Pat. No. B1-6,383,955 may be used. An embodiment of this material is commercially available under the name Aurora™ which is marketed by ASM International from Bilthoven, the Netherlands.

In the embodiment shown in FIGS. 1A-D the dielectric material 12 is a low-K material and the metal 15 is copper. In this case it is preferred that the dielectric material 12 and the metal 15 of the pre-fabricated integrated circuit 10 are separated by the barrier layer 14 in order to reduce the diffusion of copper into and/or through the dielectric material 12. The barrier layer 14 is electrically conducting, but its relatively low electrical conductivity prevents its use as a conductor other than for a relatively small resistance corresponding to the thickness of the barrier layer 14. The barrier layer 14 may, e.g., comprise tantalum and tantalum nitride. After finishing the method the barrier layer 14 and the metal 15 inside the opening 13 are parts of the in-laid metal structure.

In another embodiment, not shown, the barrier layer 14 is omitted and the dielectric material 12 and the metal 15 are in direct contact.

In the next step of the method, portions of the metal 15 outside the opening 13 are removed by polishing for a first period of time using a polishing liquid 24. The polishing process may comprise chemical mechanical polishing (CMP) and/or abrasive-free polishing (AFP). When using CMP the polishing liquid 24 may comprise relatively small amounts such as, e.g., 2-5 weight % of abrasive particles. Alternatively, or in addition, abrasive particles may be fixed to the polishing surface 22 of the polishing member 27 shown in FIG. 2 and described below. For relatively soft metals 15 such as, e.g., copper it is preferred that the polishing liquid 24 comprises less than 0.5 weight % of abrasive particles. In this case it is even more preferred that the polishing liquid 24 is substantially free from abrasive particles.

Preferably, the polishing liquid 24 is optimized for removing bulk material of metal 15, i.e. interactions between the metal 15 and the underlying material are not considered when adjusting the composition of the polishing liquid 24. Therefore, it is advantageous if during the first period of time the metal 15 is removed to the extent that interactions between the metal 15 and the underlying material, e.g. the barrier layer 14 if present, are not determining the material removal yet, while the metal 15 is removed as much as possible. This optimum is approximately reached when the underlying material, in the embodiment of FIGS. 1A-D the barrier layer 14, starts to be locally exposed as shown in FIG. 1B. Alternatively, portions of the metal 15 may be removed during the first period of time only to such an extent that the underlying material is not fully exposed, yet provided that a substantial amount of metal 15 outside the opening 13 is removed during the first period of time.

Once parts of the underlying material are exposed, the polishing liquid 24 is no longer optimized for efficient removal of the metal 15 outside the opening 13 because of the above mentioned interactions between the metal 15 and the underlying layer. It has been found experimentally that once the underlying layer, in the embodiment of FIGS. 1A-D the barrier layer 14, is exposed, the metal removal rate is reduced. This effect is found to be particularly severe if the metal 15 comprises copper and if the barrier layer 14 is present. It may, however, also occur when the barrier layer 14 is omitted. In this case the interaction between the metal 15 and the underlying material such as, e.g., the dielectric material 12 may reduce the material removal rate as well.

According to the invention an etching agent 25 is added to the polishing liquid 24 while polishing is continued for a second period of time for removing portions of the remaining metal 15 outside the opening 13. By adding the etching agent 25 the metal removal rate is increased and extensive overpolishing, which deteriorates the yield, can be avoided. The metal 15 outside the opening 13 is then removed during the second period of time resulting in the pre-fabricated IC shown in FIG. 1C. Preferably, the etching agent is acidic and has a relatively small tendency to promote the formation of oxides. It may comprise, e.g., HCl in a concentration of 0.05 to 1 M. Preferably, the second period of time is about 1-5 seconds.

After the second period of time a further polishing liquid 240 is added while polishing is continued for a third period of time for removing the etching agent from the pre-fabricated integrated circuit 10. The further polishing liquid 240 may be substantially identical to the polishing liquid 24. Alternatively, it may be de-ionized water to which a corrosion inhibitor may be added. Preferably, the third period of time is about 30-60 seconds.

The above-described method may be executed using the polishing apparatus 20 shown in FIG. 2. The polishing apparatus 20 comprises a polishing member 27 having a polishing surface 22. The polishing member 27 is a substantially flat disk which is rotatable around an axis as indicated by arrow 28, the axis being substantially perpendicular to the polishing surface 22. The polishing surface 22 may comprise abrasive particles fixed to the polishing surface 22. Alternatively, the polishing surface 22 may comprise abrasive particles, which are not fixed to the polishing surface 22 but which are supplied to the polishing surface 22 as part of the polishing liquid 24 by a polishing liquid supply unit 23. Preferably, the polishing surface 22 and the polishing liquid 24 are free of abrasive particles, in particular when the metal 15 comprises copper.

The polishing apparatus 20 further comprises a polishing liquid supply unit 23 for supplying the polishing liquid 24 during the first period of time and the further polishing liquid 240 during the third period of time to the polishing surface 22. During the first period of time at least that part of the polishing surface 22 which is in contact with the pre-fabricated IC 10, is substantially covered by a film formed by the polishing liquid 24. During the third period of time at least that part of the polishing surface 22 which is in contact with the pre-fabricated IC 10, is substantially flushed by the further polishing liquid 240. In the embodiment of FIG. 2 the polishing liquid 24 and the further polishing liquid 240 are supplied by the same nozzle. In another embodiment, not shown, the further polishing liquid 240 is supplied by a further nozzle. This is in particular advantageous if the polishing liquid 24 and the further polishing liquid 240 do not have identical chemical compositions.

The polishing station 21 has a workpiece holder 40 for holding the pre-fabricated IC 10 and for pressing it against the polishing surface 22. In the embodiment shown in FIG. 2, the workpiece holder 40 can be rotated by a motor around a further axis as indicated by arrow 42.

The polishing apparatus 20 further comprises an etching agent supply unit 33 for supplying the etching agent 25 to the polishing surface 22. The etching agent 25 is dispensed by a nozzle 31 designed to dispense small amounts of, e.g., 1-20 ml of etching agent. The amount and the moment of dispensing the etching agent 25 are controlled by a system control unit 26, i.e. the system control unit 26 enables the etching agent supply unit 33 to add the etching agent 25 to the polishing liquid 24 on the polishing surface 22 after having polished a pre-fabricated IC 10 for a first period of time. The system control unit 26 is a computer provided with an information carrier 28 with a computer program. The computer program comprises instructions to execute the method according to the invention.

In one embodiment the polishing tool 20 further comprises an end point detector 35 for detecting an end point and for providing an end point signal to the system control unit 26. The system control unit is arranged to enable the etching agent supply unit 33 to add the etching agent 25 to the polishing liquid 24 when being provided with the end point signal. Preferably, the etching agent 25 is supplied directly after detecting the end point signal. The end point detector often is an optical system which measures the reflectivity of the surface of the pre-fabricated IC being polished. When a lower layer of material, e.g. the barrier layer, if present, is exposed, the reflectivity of the surface changes and an end point signal is generated by the end point detector. The end point detector 35 is integrated into the polishing apparatus 20. It comprises a laser which is directed to the surface being polished via a small window in the polishing surface 22.

Alternatively, the moment at which the etching agent is to be added, i.e. when the first period of time ends and the second period of time starts, may be determined without an end point detector 35 by visual inspection of the pre-fabricated IC surface being polished. To this end polishing is interrupted from time to time and the surface is inspected. When the material below the metal 15 is exposed the reflectivity of the surface changes. By adding up the total polishing time required to reach this state, the duration of the first period of time is obtained. Once the duration of the first period of time is determined using, e.g., this criterion, the etching agent is added, either manually or, preferably, automatically to the polishing liquid 24 after having polished for this duration.

In the embodiment shown in FIG. 2, the polishing surface 22 has an area 45 which during polishing is contacted by the pre-fabricated IC 10, and the etching agent supply unit 33 is arranged to supply the etching agent 25 to the area 45. The area 45 has an outer edge 46 in a radial direction and the etching agent supply unit 33 is arranged to supply the etching agent 25 close to the outer edge 46. Preferably, the etching agent 25 is supplied within at most 5 cm from the outer edge 46.

In summary, the invention relates to a method of manufacturing an IC starting with providing a pre-fabricated integrated circuit 10 comprising an electrical device 2 and having a surface 11 coated with a dielectric material 12 and a metal 15. The dielectric material 12, which may be separated from the metal 15 by the barrier layer 14, has an opening 13, which is filled by the metal 15. Portions of the metal 15 outside the opening 13 are removed by polishing for a first period of time, after which an etching agent 25 is added to the polishing liquid 24 and polishing is continued for a second period of time for removing portions of the metal 15 remaining outside the opening 13. The polishing apparatus 40 is able to perform this method.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention claimed is:

1. A method of manufacturing an integrated circuit, the method comprising the steps of:

provindg a pre-fabricated integrated circuit comprising an electrical device and having a surface coated with, in this order, a dielectric material and a metal, the dielectric material having an opening, and the metal extending into and filling substantially all of the opening thereby electrically contacting the electrical device, removing portions of the metal outside the opening by polishing for a first period of time using a polishing liquid, and adding an etching agent to the polishing liquid while continuing polishing for a second period of time for removing portions of the metal remaining outside the opening that are on top of and in contact with the dielectric material during the second time period and for removing portions of the metal extending across an upper portion of the opening.

2. A method as claimed in claim 1, wherein after the second period of time a further polishing liquid is added while continuing polishing for a third period of time for removing the etching agent from the pre-fabricated integrated circuit.

3. A method as claimed in claim 2, wherein the third period of time is between 15 and 120 seconds.

4. A method as claimed in claim 1, wherein the second period of time is shorter than 15 seconds.

5. A method as claimed in claim 4, wherein the second period of time is shorter than 5 seconds.

6. A method as claimed in claim 1, wherein removing portions of the metal outside the opening by polishing for a first period of time using a polishing liquid includes removing portions of the metal at a first rate of removal, and adding an etching agent to the polishing liquid while continuing polishing for a second period of time for removing portions of the metal remaining outside the opening includes adding the etching agent to remove portions of the metal at a second rate of removal that is greater than the first rate of removal.

7. A method as claimed in claim 1, wherein the step of removing portions of the metal outside the opening by polishing for a first period of time using a polishing liquid includes using a polishing liquid having an etching agent, and the step of adding an etching agent to the polishing liquid while continuing polishing for a second period of time includes adding more of the etching agent used in the first step to increase the concentration of the etching agent in the polishing liquid.

8. A method as claimed in claim 1, wherein the step of removing portions of the metal outside the opening by polishing for a first period of time using a polishing liquid includes using a polishing liquid having a first etching agent, and the step of adding an etching agent to the polishing liquid while continuing polishing for a second period of time includes adding a second etching agent that is different than the first etching agent.

9. A method as claimed in claim 1, wherein the step of adding an etching agent to the polishing liquid while continuing polishing for a second period of time includes using an oxidizer and a corrosion inhibiter in the polishing liquid to control the removal of the metal and to mitigate at least one of: erosion and dishing.

10. A method as claimed in claim 1, wherein the step of adding an etching agent to the polishing liquid while continuing polishing for a second period of time includes polishing the metal to provide a contact, consisting of the metal, extending from an upper polished surface of the integrated circuit to the electrical device, the metal directly contacting the electrical device.

11. A method as claimed in claim 1, wherein the dielectric material is in contact with the surface and the metal is in contact with the dielectric material, and wherein the dielectric material is a single type of material.

12. A method as claimed in claim 1, wherein the pre-fabricated integrated circuit does not include a barrier layer between the dielectric material and the metal.

13. A method of manufacturing an integrated circuit, the method comprising the steps of:

providing a pre-fabricated integrated circuit comprising an electrical device and having a surface coated with, in this order, a dielectric material, a barrier layer and a metal, the dielectric material having an opening, the barrier layer lining the opening and the metal extending into and filling substantially all of the lined opening over the barrier layer, thereby electrically contacting the electrical device via the barrier layer, removing portions of the metal outside the opening by polishing for a first period of time using a polishing liquid to locally expose the barrier layer, and adding an etching agent to the polishing liquid while continuing polishing for a second period of time for removing portions of the metal remaining outside the opening that are on top of and in contact with at least one of the barrier layer and the dielectric material during the second time period.

14. A method as claimed in claim 1, wherein the pre-fabricated integrated circuit is polished using a polishing member having a polishing surface, the polishing surface being provided with the polishing liquid, the etching agent being added to the polishing liquid by providing the etching agent to the polishing surface.

15. A method as claimed in claim 13, wherein the step of removing portions of the metal outside the opening by polishing for a first period of time using a polishing liquid includes using a polishing liquid having an etching agent, and the step of adding an etching agent to the polishing liquid while continuing polishing for a second period of time includes adding more of the etching agent used in the first step to increase the concentration of the etching agent in the polishing liquid.

16. A method as claimed in claim 13, wherein the step of removing portions of the metal outside the opening by polishing for a first period of time using a polishing liquid includes using a polishing liquid having a first etching agent, and the step of adding an etching agent to the polishing liquid while continuing polishing for a second period of time includes adding a second etching agent that is different than the first etching agent.

17. A method as claimed in claim 13, wherein the step of adding an etching agent to the polishing liquid while continuing polishing for a second period of time includes using an oxidizer to control the removal of the metal.

18. A method as claimed in claim 13, wherein the barrier layer lining the opening is in contact with the dielectric material.

19. A method as claimed in claim 13, wherein the dielectric material is in contact with the surface, the barrier layer is in contact with the dielectric material and the metal is in contact with the barrier layer, and wherein the dielectric material is a single type of material.

20. A method as claimed in claim 13, wherein the step of adding an etching agent to the polishing liquid while continuing polishing for a second period of time does not include removing the barrier layer during the second time period.

* * * * *